(12) United States Patent
Glodde et al.

(10) Patent No.: US 9,431,250 B2
(45) Date of Patent: Aug. 30, 2016

(54) DEEP WELL IMPLANT USING BLOCKING MASK

(71) Applicant: International Business Machines Corporation, Armonk, NY (US)

(72) Inventors: Martin Glodde, Pine Brook, NJ (US); Steven J. Holmes, Ossining, NY (US); Daiji Kawamura, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 167 days.

(21) Appl. No.: 14/199,282

(22) Filed: Mar. 6, 2014

(65) Prior Publication Data

US 2015/0255286 A1 Sep. 10, 2015

(51) Int. Cl.
*H01L 21/027* (2006.01)
*H01L 21/18* (2006.01)
*H01L 21/34* (2006.01)
*H01L 21/266* (2006.01)

(52) U.S. Cl.
CPC .................................. *H01L 21/266* (2013.01)

(58) Field of Classification Search
CPC ...................................................... H01L 21/266
See application file for complete search history.

(56) References Cited

U.S. PATENT DOCUMENTS

| | | |
|---|---|---|
| 6,399,446 B1 | 6/2002 | Rangarajan et al. |
| 6,815,364 B2 | 11/2004 | Stojakovic et al. |
| 7,001,712 B2 | 2/2006 | Imai et al. |
| 7,074,722 B2 | 7/2006 | Lee et al. |
| 7,867,911 B2 | 1/2011 | Nam et al. |
| 8,350,365 B1 | 1/2013 | Wu et al. |
| 8,426,319 B2 | 4/2013 | Mistkawi et al. |
| 2011/0124134 A1* | 5/2011 | Lin ................... H01L 21/28008 438/14 |
| 2014/0061154 A1* | 3/2014 | Kim ...................... G03F 7/0035 216/49 |

* cited by examiner

*Primary Examiner* — Mohammad Choudhry
(74) *Attorney, Agent, or Firm* — Steven J. Meyers; Hoffman Warnick LLC

(57) ABSTRACT

Various methods include: forming an opening in a resist layer to expose a portion of an underlying blocking layer; performing an etch on the exposed portion of the blocking layer to expose a portion of an etch stop layer, wherein the etch stop layer resists etching during the etch of the exposed portion of the blocking layer; etching the exposed portion of the etch stop layer to expose a portion of a substrate below the exposed portion of the etch stop layer and leave a remaining portion of the etch stop layer; and ion implanting the exposed portion of the substrate, wherein the blocking layer prevents ion implanting of the substrate outside of the exposed portion.

19 Claims, 10 Drawing Sheets

DEEP WELL IMPLANT USING BLOCKING MASK

BACKGROUND

The subject matter disclosed herein relates to integrated circuit devices. More particularly, the subject matter relates to implanting semiconductor structures to form integrated circuit devices.

As integrated circuit (IC) technologies have advanced, the size of these devices has correspondingly decreased. In particular, as devices are reduced in scale to comply with ever-smaller packaging, tighter constraints are applied to their dimensions and spacings.

Lithography and implanting are commonly used techniques to form components in ICs, e.g., from semiconductor materials. Implanting has been especially beneficial as IC technologies have reduced in scale, however, due to that reduction in scale, it is difficult to accurately implant deep into semiconductor structures. In particular, the high aspect ratio required for lithographical implanting at desired device depths can limit the accuracy of the implant, which limits the ability to scale formation of a semiconductor device using this technique.

SUMMARY

Various embodiments include a method including: forming an opening in a resist layer to expose a portion of an underlying blocking layer, the blocking layer overlying an etch stop layer overlying a substrate; etching the portion of the blocking layer, exposing a portion of the etch stop layer below the etched portion of the blocking layer, wherein the etch stop layer resists etching during the RIE; etching the exposed portion of the etch stop layer to expose a portion of the substrate below the etched portion of the etch stop layer and leave a remaining portion of the etch stop layer; and implanting the exposed portion of the substrate, wherein the blocking layer prevents implanting of the substrate outside of the exposed portion.

A first aspect includes a method including: forming an opening in a resist layer to expose a portion of an underlying blocking layer, the blocking layer overlying an etch stop layer overlying a substrate; etching the exposed portion of the blocking layer, exposing a portion of the etch stop layer below the etched portion of the blocking layer, wherein the etch stop layer resists etching during the RIE; etching the exposed portion of the etch stop layer to expose a portion of the substrate below the etched portion of the etch stop layer and leave a remaining portion of the etch stop layer; and implanting the exposed portion of the substrate, wherein the blocking layer prevents implanting of the substrate outside of the exposed portion.

A second aspect includes a method including: providing a precursor structure having: a substrate; an etch stop layer over a substrate; a blocking layer, including tungsten (W), over the etch stop layer; and a resist layer over the blocking layer; forming an opening in the resist layer to expose the blocking layer; etching the blocking layer to expose a portion of the etch stop layer, wherein the etch stop layer resists etching during the etching; etching the exposed portion of the etch stop layer to expose a portion of the substrate below the exposed portion of the etch stop layer and leave a remaining portion of the etch stop layer; implanting the exposed portion of the substrate, wherein the blocking layer prevents implanting of the substrate outside of the exposed portion of the substrate; and stripping the blocking layer and the etch stop layer after the implanting.

A third aspect includes a method including: providing a precursor structure having: a substrate; an etch stop layer including zirconium anti-reflective coating (ZrARC) over the substrate; a blocking layer, including tungsten (W), over the etch stop layer; and a resist layer over the blocking layer; forming an opening in the resist layer to expose a portion of the blocking layer; performing a reactive ion etch (RIE) on the exposed portion of the blocking layer to expose a portion of the etch stop layer below the exposed portion of the blocking layer, wherein the etch stop layer resists etching during the RIE; etching the exposed portion of the etch stop layer below the opening within the blocking layer to expose a portion of the substrate and leave a remaining portion of the etch stop layer; and implanting the exposed portion of the substrate, wherein the blocking layer prevents implanting of the substrate outside of the exposed portion.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
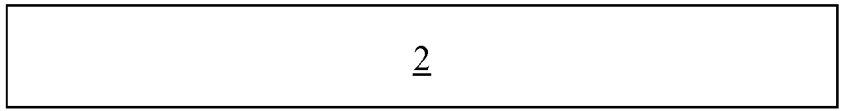
FIG. 1 shows a schematic cross-sectional depiction of a precursor substrate according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuit (IC) devices. More particularly, the subject matter relates to deep well implanting in semiconductor materials to form IC devices.

According to various embodiments, methods include forming a resist layer and a high-density blocking layer over a substrate to allow for deep well implanting in high aspect-ratio designs. The high-density blocking layers disclosed according to various embodiments include tungsten (W) in most cases. In some alternative embodiments, the high-density blocking layers include silicon nitride (SiN).

In the case of a tungsten blocking layer, this blocking layer has substantially greater ability to block an implant ion than conventional silicon-based blocking layers. For example, tungsten has an atomic weight of over ten (10) times that of silicon, and a density nearly ten (10) times that of silicon. Further, as noted herein, tungsten has an ability to stop implant species of approximately 8-10 times (e.g., in terms of distance of ion travel) that of silicon. As described herein, use of tungsten as a blocking layer can also reduce the stack height of an IC device when compared with conventional devices that use silicon blocking layers, some times by as much as ten-fold.

Some particular embodiments include a method including: providing a precursor structure having: a substrate; an etch stop layer over a substrate; a blocking layer, including tungsten (W), over the etch stop layer; a developable bottom anti-reflective coating (DBARC) over the blocking layer; and a resist layer over the DBARC; exposing and developing the resist layer and the DBARC to expose the blocking layer; performing an etch on the blocking layer to expose the etch stop layer below an opening within the blocking layer, wherein the etch stop layer resists etching during the etch; stripping the resist layer and the DBARC to expose an upper surface of the blocking layer; etching the exposed portion of the etch stop layer below the opening within the blocking layer to expose the substrate below the opening within the blocking layer and leave a remaining portion of the etch stop layer; ion implanting the exposed substrate, the remaining portion of the etch stop layer and the overlying blocking layer, wherein the blocking layer prevents ion implanting of the substrate outside of the opening within the blocking layer; and stripping the blocking layer and the etch stop layer after the ion implanting.

Other particular embodiments include a method including: providing a precursor structure having: a substrate; an etch stop layer including zirconium anti-reflective coating (ZrARC); a blocking layer, including tungsten (W), over the etch stop layer; a developable bottom anti-reflective coating (DBARC) over the blocking layer; and a resist layer over the DBARC; exposing and developing the resist layer and the DBARC to expose the blocking layer; performing a reactive ion etch (RIE) on the blocking layer to expose a portion of the etch stop layer below an opening within the blocking layer, wherein the etch stop layer resists etching during the RIE; stripping the resist layer and the DBARC to expose an upper surface of the blocking layer; etching the exposed portion of the etch stop layer below the opening within the blocking layer to expose the substrate below the opening within the blocking layer and leave a remaining portion of the etch stop layer; implanting (ions) the exposed substrate and the remaining portion of the etch stop layer, wherein the blocking layer prevents implanting of the substrate outside of the opening within the blocking layer; and stripping the blocking layer and the etch stop layer after the ion implanting.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

FIGS. 1-10 show schematic cross-sectional depictions of integrated circuit structures (and precursor structures) that illustrate processes performed according to various embodiments. It is understood that the processes outlined herein may be performed in a different order than described in some embodiments. Additionally, not all of the processes outlined herein need necessarily be performed according to various embodiments. For example, in some embodiments, particular layers (e.g., developable bottom anti-reflective coating (DBARC)) may be omitted without deviating from the spirit of the disclosure, and in other embodiments, processes may be omitted (e.g., stripping the resist layer and/or the DBARC) without deviating from the spirit of the disclosure.

Turning to FIG. 1, a precursor substrate 2 is shown. The substrate 2 can include any conventional substrate material known in the art, e.g., silicon, silicon dioxide ($SiO_2$), germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained.

Figure 2:
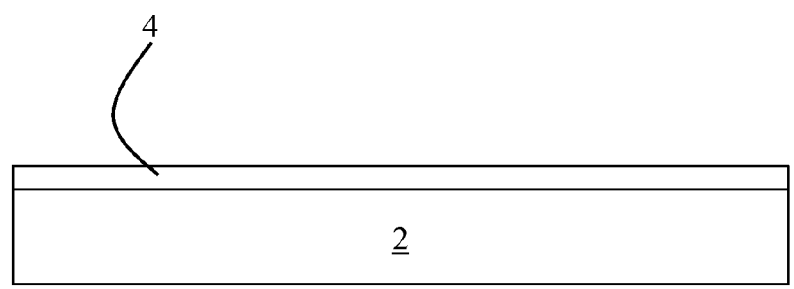
FIG. 2 shows a schematic cross-sectional depiction of a structure undergoing a process according to various embodiments.

FIG. 2 depicts a first pre-process (optional in some embodiments) of forming an etch stop layer 4 over the substrate 2. In various embodiments, the etch stop layer 4 can include a titanium anti-reflective coating (TiARC). In these embodiments, the etch stop layer 4 (TiARC) can be spin-applied the over the substrate 2. In other embodiments, the etch stop layer includes a zirconium anti-reflective coating (ZrARC), and in these embodiments, the ZrARC may be spin-applied over the substrate 2. In still other embodiments, the etch stop layer 4 can include titanium (Ti) or titanium nitride (TiN), and may be deposited, epitaxially grown, or otherwise formed over the substrate 2 according to processes known in the art.

As described herein, "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 3:
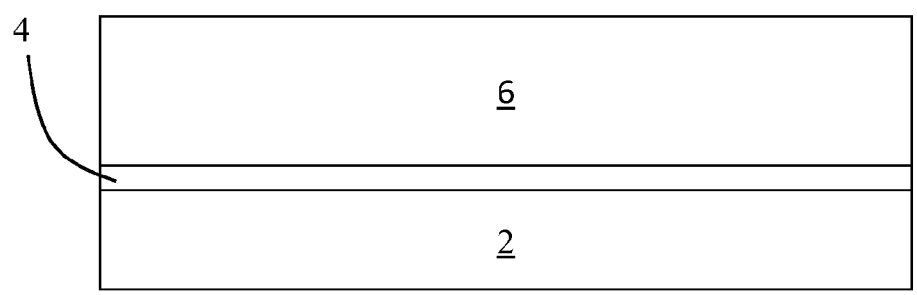
FIG. 3 shows a schematic cross-sectional depiction of a structure undergoing a process according to various embodiments.

FIG. 3 depicts a second pre-process of forming a blocking layer 6 over the etch stop layer 4 (optional in some embodiments). As described herein, the blocking layer 6 can be utilized to inhibit (block) ion implanting in unwanted areas of underlying layers, e.g., the substrate 2 during subsequent processes. The blocking layer 6, when combined with the etch stop layer 4, can provide for enhanced scaling of an IC device including these material combinations according to various embodiments. In any case, the blocking layer 6 is formed over the etch stop layer 4 according to various embodiments. In some cases, the blocking layer 6 includes a high-density material, e.g., a material with a density greater than approximately 15 g/cm$^{-3}$. In some particular embodiments, the blocking layer 6 includes tungsten (W), which has a density of approximately 19 g/cm$^{-3}$ at room temperature. This high density can allow the blocking layer 6 to effectively inhibit ion implanting to underlying layers as described herein. In some alternative embodiments, the blocking layer 6 can include silicon nitride (SiN). In various embodiments, the blocking layer 6 has a thickness of approximately 50 nanometers (nm) to approximately 400 nm, and in some particular embodiments, the blocking layer 6 has a thickness of approximately 150 nanometers to approximately 300 nanometers. These example thicknesses of the blocking layer 6 could be used in the case of a deep well implant, e.g., approximately 500 nm deep. These blocking layer thicknesses are in contrast to the conventional resist-based ion blocking approaches, which employ resists with thicknesses of approximately 750-1100 nanometers (nm), which can limit device scaling. That is, the blocking layer 6 shown and described according to various embodiments can be substantially thinner than the resist used in conventional resist-based ion blocking approaches, while preventing implant into underlying layers as described herein.

Figure 4:
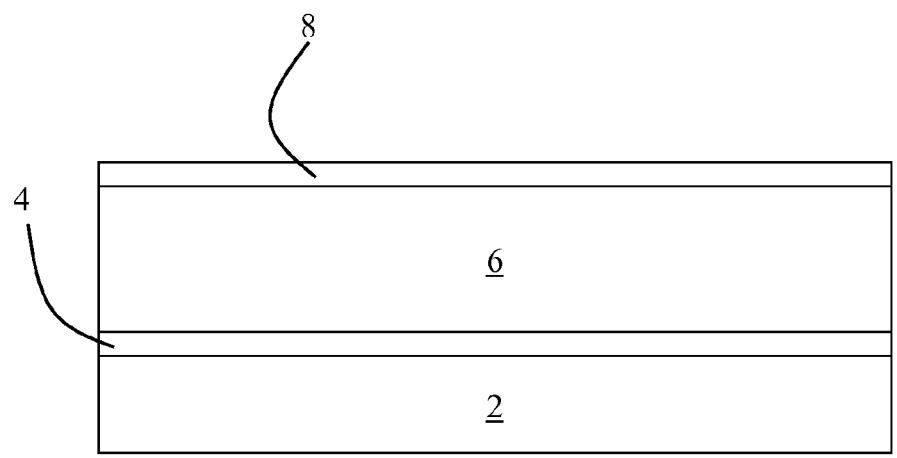
FIG. 4 shows a schematic cross-sectional depiction of a structure undergoing a process according to various embodiments.

Following formation of the blocking layer 6, another pre-process (optional in some embodiments) can include forming a developable bottom anti-reflective coating (DBARC) 8 over the blocking layer, as illustrated in FIG. 4. As is known in the art, the DBARC 8 can include, for example: DBARC A520 for Argon Flouride (ArF) (laser) lithography, available from Brewer Science®, Rolla, Mo.; DS-K101 for deep ultra-violet (DUV) lithography, also from Brewer Science®; or AR 602 DBARC for krypton fluoride (KrF) and/or ArF lithography, available from Dow® Chemical Company, Midland, Mich. The DBARC 8 can be formed, e.g., deposited, spin-applied, grown, etc., via any conventional process.

Figure 5:
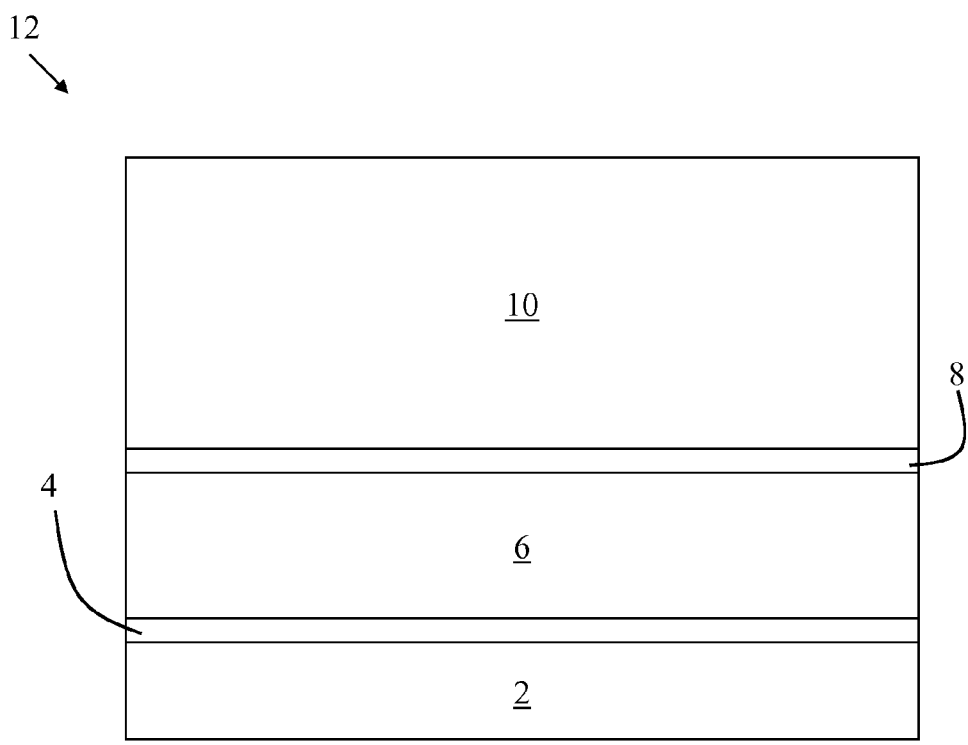
FIG. 5 shows a schematic cross-sectional depiction of a structure undergoing a process according to various embodiments.

FIG. 5 depicts an additional pre-process (optional in some embodiments) including forming a resist layer 10 over the DBARC 8. The resist layer 10 can include any conventional resist material, e.g., photoresist material known in the art. FIG. 5 depicts a "precursor structure" 12, prior to performing additional processes according to various embodiments described herein.

Figure 6:
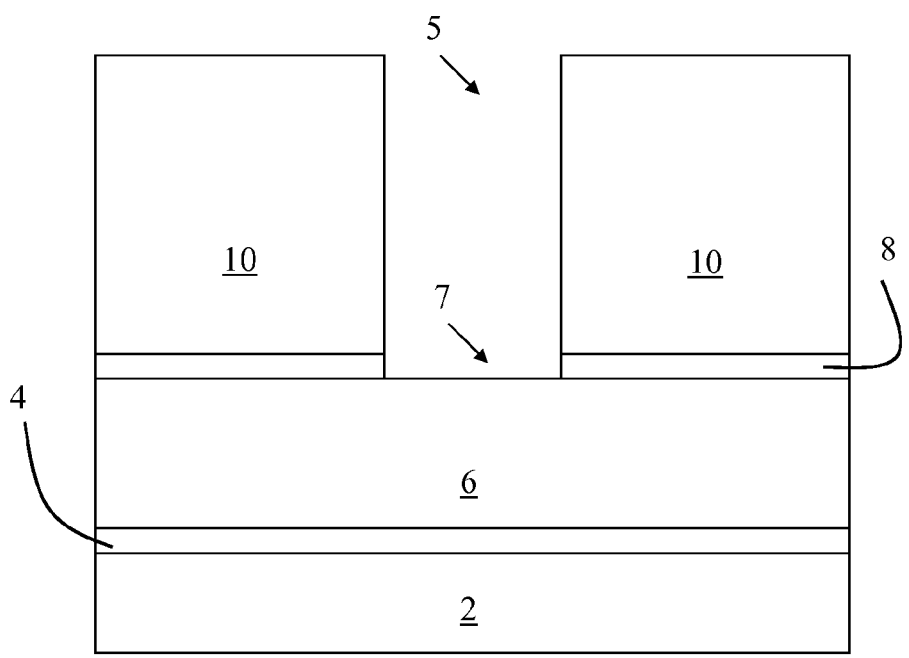
FIG. 6 shows a schematic cross-sectional depiction of a structure undergoing a process according to various embodiments.

FIG. 6 depicts a first process performed on the precursor structure 12 in FIG. 5, namely, forming an opening 5 in the resist layer 10 and the DBARC 8 (e.g., exposing and developing the resist layer 10 and removing the DBARC 8) to expose a portion 7 the blocking layer 6. This can include conventional masking/photolightographical etching processes known in the art.

Figure 7:
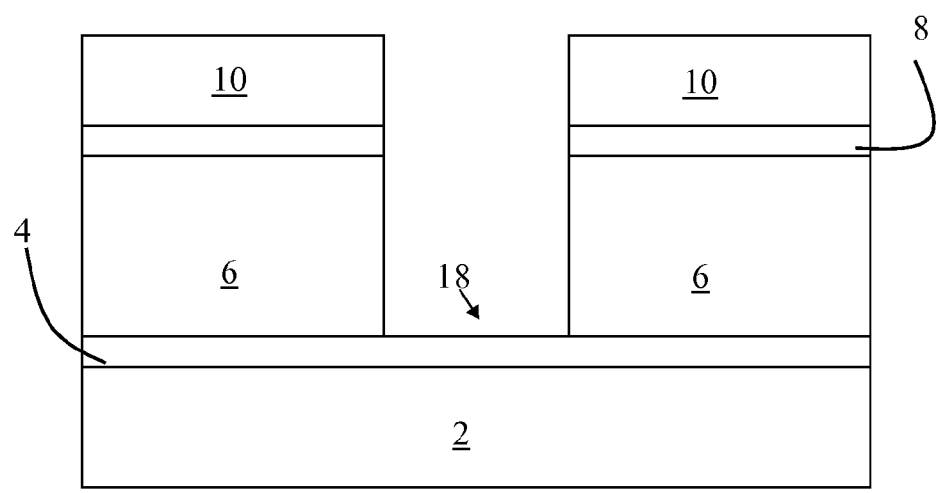
FIG. 7 shows a schematic cross-sectional depiction of a structure undergoing a process according to various embodiments.

FIG. 7 depicts a process including etching (e.g., performing a reactive ion etch (RIE) on) the blocking layer 6, which exposes a portion 18 of the etch stop layer 4 below the (previously exposed) portion 7 of the blocking layer 6. As described herein, the etch stop layer 4 resists etching during the etch process (e.g., RIE) on the blocking layer 6. According to various embodiments, the RIE process on the blocking layer 6 includes using a fluorine (F) etch.

Figure 8:
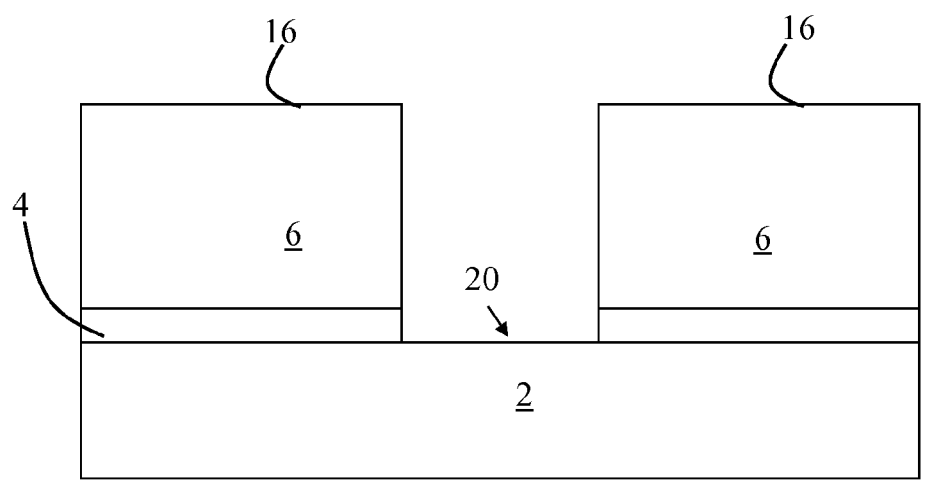
FIG. 8 shows a schematic cross-sectional depiction of a structure undergoing a process according to various embodiments.

Following etching of the blocking layer 6 to expose the portion 18 of the etch stop layer 4, an additional process (optional in some embodiments), depicted in FIG. 8, can include stripping the resist layer 10 and the DBARC 8 to expose an upper surface 16 of the blocking layer 6. In various embodiments, the stripping of the resist layer 10 and the DBARC 8 can include using a diazene ($N_2H_2$) etch.

FIG. 8 also depicts an additional process of etching the exposed portion 18 of the etch stop layer 4 to expose a portion 20 of the substrate 2 (exposed portion 20) below the (previously exposed) portion 18 of the etch stop layer 4. In various embodiments, the exposed portion 18 of the etch stop layer 4 is etched using an NH4OH:H2O2:H2O mixture (SC1) RIE process or a chlorine (Cl) RIE process.

Figure 9:
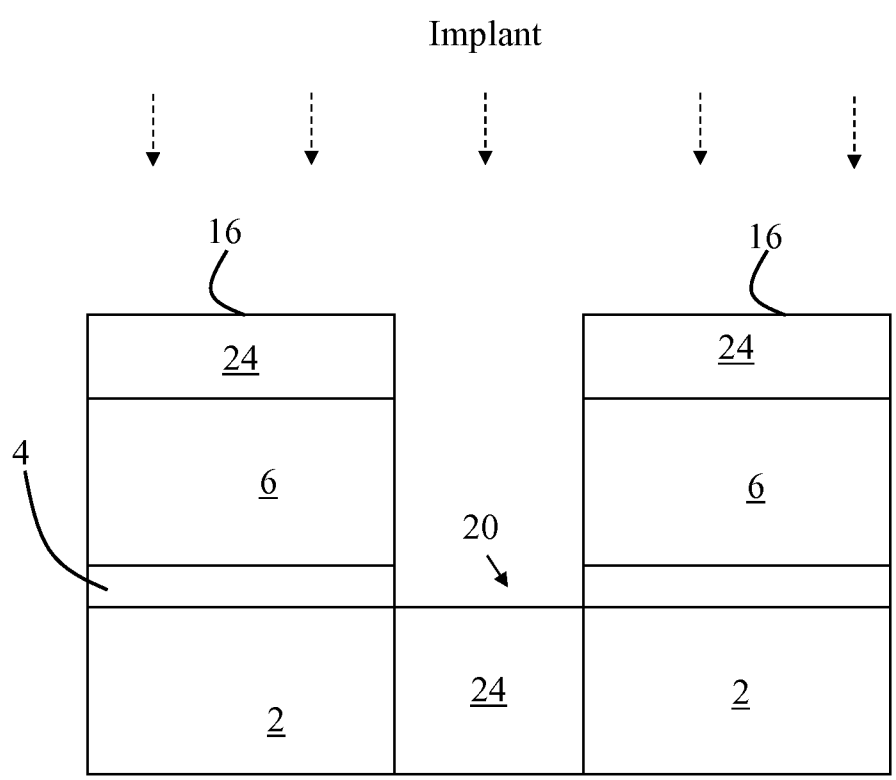
FIG. 9 shows a schematic cross-sectional depiction of a structure undergoing a process according to various embodiments.

FIG. 9 depicts an additional process of ion implanting the exposed portion 20 of the substrate 2 (and in some cases, the exposed upper surface 16 of the blocking layer 6), where the blocking layer 6 prevents implanting of the substrate 2 outside of the exposed portion 20 of the substrate 2. As described herein, ion implanting can be performed according to convention ion implanting processes known in the art. Implanted regions 24 are shown in the blocking layer 6 and the substrate 2, exclusive of those portions of the substrate 2 covered by the etch stop layer 4 and overlying blocking layer 6. According to various embodiments, the process of implanting the substrate 2 includes implanting to a depth (as measured from upper surface of the substrate 2) of approximately 600 nm to approximately 50 nm, where in some cases (e.g., where blocking layer 6 includes tungsten), the implanting of the blocking layer 6 includes implanting to a depth of approximately 60 nm to approximately 5 nm.

Figure 10:
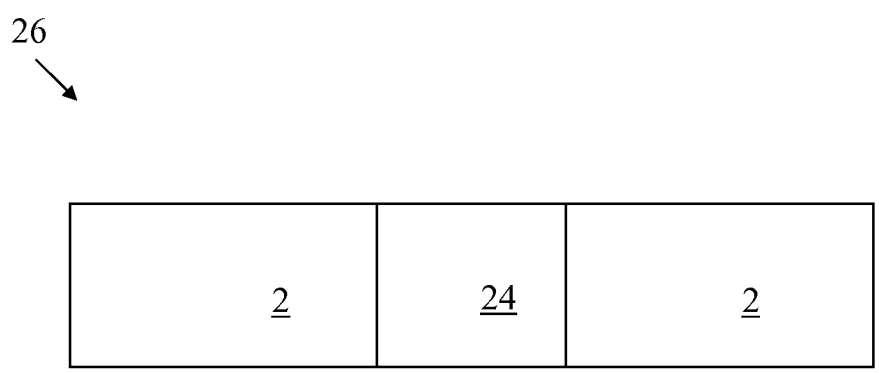
FIG. 10 shows a schematic cross-sectional depiction of a structure undergoing a process according to various embodiments.

FIG. 10 depicts an optional post-process including stripping the blocking layer 6 and the etch stop layer 4 after the implanting process. According to various embodiments, the stripping of the etch stop layer 4 and the blocking layer 6 includes using an NH4OH:H2O2:H2O mixture (SC1) etch or dilute hydrogen fluoride (DHF) etch. After stripping of the etch stop layer 4 and the blocking layer 6, a partially implanted substrate 26 remains.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method comprising:
    forming an opening in a resist layer to expose a portion of an underlying blocking layer, the blocking layer overlying an etch stop layer overlying a substrate,
        wherein a developable bottom anti-reflective coating (DBARC) layer lies over the blocking layer and under the resist layer;
    etching the exposed portion of the blocking layer, exposing a portion of the etch stop layer below the etched portion of the blocking layer, wherein the etch stop layer resists etching during the etching of the exposed portion of the blocking layer;
    etching the exposed portion of the etch stop layer to expose a portion of the substrate below the etched portion of the etch stop layer;
    ion implanting the exposed portion of the substrate, wherein the blocking layer prevents implanting of the substrate outside of the exposed portion;
    stripping the resist layer and the DBARC to expose an upper surface of the blocking layer prior to the etching of the exposed portion of the etch stop layer; and
    stripping the blocking layer and the etch stop layer after the ion implanting.

2. The method of claim 1, wherein the stripping the etch stop layer and the blocking layer includes using an $NH_4OH:H_2O_2:H_2O$ mixture (SC1) etch or dilute hydrogen fluoride (DHF) etch.

3. The method of claim 1, wherein the etch stop layer includes titanium anti-reflective coating (TiARC).

4. The method of claim 3, wherein the forming of the etch stop layer includes spin-applying the TiARC over the substrate.

5. The method of claim 1, wherein the etch stop layer includes a zirconium anti-reflective coating (ZrARC).

6. The method of claim 5, wherein the forming of the etch stop layer includes spin-applying the ZrARC over the substrate.

7. The method of claim 1, wherein the etch stop layer includes titanium (Ti) or titanium nitride (TiN).

8. The method of claim 1, wherein the blocking layer includes tungsten (W), wherein the ion implanting of the exposed portion of the substrate includes implanting ions to a depth of approximately 600 nanometers (nm) to approximately 50 nm, measured from an upper surface of the substrate, and further comprising ion implanting the blocking layer during the ion implanting of the exposed portion of the substrate to a depth of approximately 60 nm to approximately 5 nm.

9. The method of claim 8, wherein the etching includes reactive ion etching (RIE), and wherein the RIE on the exposed portion of the blocking layer includes a fluorine (F) etch.

10. The method of claim 1, wherein the etching of the exposed portion of the etch stop layer includes etching using an $NH_4OH:H_2O_2:H_2O$ mixture (SC1) RIE process or a chlorine (Cl) RIE process.

11. The method of claim 1, wherein the ion implanting includes implanting ions to a depth of approximately 500 nm nanometers in the exposed portion of the substrate, and wherein the blocking layer has a thickness of approximately 100 nm nanometers.

12. A method comprising:
    providing a precursor structure having:
        a substrate;
        an etch stop layer over the substrate;
        a blocking layer, including tungsten (W), over the etch stop layer; and
        a resist layer over the blocking layer;
    forming an opening in the resist layer to expose the blocking layer;
    etching the blocking layer to expose a portion of the etch stop layer, wherein the etch stop layer resists etching during the etching of the blocking layer;
    etching the exposed portion of the etch stop layer to expose a portion of the substrate below the exposed portion of the etch stop layer and leave a remaining portion of the etch stop layer;
    ion implanting the exposed portion of the substrate, wherein the blocking layer prevents ion implanting of the substrate outside of the exposed portion of the substrate,
        wherein the ion implanting includes implanting ions to a depth of approximately 600 nanometers (nm) to approximately 50 nm in the substrate, and wherein the blocking layer has a thickness of approximately 50 nm to approximately 400 nm; and
    stripping the blocking layer and the etch stop layer after the ion implanting.

13. The method of claim 12, wherein the ion implanting includes implanting ions into the blocking layer, wherein the blocking layer has a thickness greater than approximately 100 nm, and wherein the ion implanting of the blocking layer includes ion implanting to a depth of approximately 60 nm to approximately 5 nm.

14. The method of claim 12, wherein the etch stop layer includes a titanium anti-reflective coating (TiARC).

15. The method of claim 12, wherein the etch stop layer includes a zirconium anti-reflective coating (ZrARC).

16. The method of claim 12, wherein the etch stop layer includes a titanium (Ti) or titanium nitride (TiN).

17. A method comprising:
providing a precursor structure having:
a substrate;
an etch stop layer including zirconium anti-reflective coating (ZrARC) over the substrate;
a blocking layer, including tungsten (W), over the etch stop layer; and
a resist layer over the blocking layer;
forming an opening in the resist layer to expose a portion of the blocking layer;
performing a reactive ion etch (RIE) on the exposed portion of the blocking layer to expose a portion of the etch stop layer below the exposed portion of the blocking layer, wherein the etch stop layer resists etching during the RIE;
etching the exposed portion of the etch stop layer below the opening within the blocking layer to expose a portion of the substrate and leave a remaining portion of the etch stop layer; and
ion implanting the exposed portion of the substrate, wherein the blocking layer prevents ion implanting of the substrate outside of the exposed portion,
wherein the ion implanting includes implanting ions to a depth of approximately 500 nm nanometers in the exposed portion of the substrate, and wherein the blocking layer has a thickness of approximately 100 nm nanometers,
wherein the ion implanting includes implanting ions into the blocking layer, wherein the ion implanting of the blocking layer includes ion implanting to a depth of approximately 60 nm to approximately 5 nm.

18. The method of claim 1, wherein the etching of the exposed portion of the blocking layer is performed after the forming of the opening in the resist layer, wherein the etching of the exposed portion of the etch stop layer is performed after the etching of the exposed portion of the blocking layer, and wherein the ion implanting of the exposed portion of the substrate is performed after the etching of the exposed portion of the etch stop layer.

19. The method of claim 12, wherein the etching of the exposed portion of the blocking layer is performed after the forming of the opening in the resist layer, wherein the etching of the exposed portion of the etch stop layer is performed after the etching of the exposed portion of the blocking layer, and wherein the ion implanting of the exposed portion of the substrate is performed after the etching of the exposed portion of the etch stop layer.

* * * * *